United States Patent [19]

Fujioka et al.

[11] Patent Number: 4,598,115

[45] Date of Patent: Jul. 1, 1986

[54] POLYAMINO-BIS-MALEIMIDE PREPOLYMER, METHOD FOR MANUFACTURE THEREOF, AND METHOD FOR MANUFACTURE OF LAMINATE USING SAID PREPOLYMER

[75] Inventors: Atsushi Fujioka; Yasuo Miyadera; Tomio Fukuda, all of Shimodate, Japan

[73] Assignee: Hitachi Chemical Company, Ltd., Tokyo, Japan

[21] Appl. No.: 650,905

[22] Filed: Sep. 13, 1984

[30] Foreign Application Priority Data

Sep. 14, 1983 [JP] Japan ................................ 58-170240
Sep. 29, 1983 [JP] Japan ................................ 58-181575

[51] Int. Cl.$^4$ .............................................. C08K 5/06
[52] U.S. Cl. ................................ 524/376; 156/308.2; 428/383; 428/384; 528/322
[58] Field of Search ...................... 528/322; 524/376

[56] References Cited

U.S. PATENT DOCUMENTS 4,038,450  7/1977  Balme et al. ........................ 528/322
4,115,341  9/1978  Boldebuck et al. ................. 524/376

Primary Examiner—Jacob Ziegler
Attorney, Agent, or Firm—Gordon W. Hueschen

[57] ABSTRACT

A polyamino-bis-maleimide prepolymer solution obtained by the reaction of 1 mole of N,N'-4,4'-diphenyl methane-bis-maleimide with 0.25 to 0.4 mol of 4,4'-diaminodiphenyl methane in an alkyleneglycol monoalkyl ether as a solvent at elevated temperatures. This solution can be impregnated with a substrate to form a prepreg. The prepreg can be laminated to form heat resistant laminate.

9 Claims, No Drawings

POLYAMINO-BIS-MALEIMIDE PREPOLYMER, METHOD FOR MANUFACTURE THEREOF, AND METHOD FOR MANUFACTURE OF LAMINATE USING SAID PREPOLYMER

BACKGROUND OF THE INVENTION

1. Field of the Invention

This invention relates to polyamino-bis-maleimide prepolymer, a method for the manufacture thereof, and a method for the manufacture of a laminate using the prepolymer.

2. Description of Prior Art

Heretofore, in the field of heat-resistant laminates which are required to possess high levels of heat resistance, reliability of throughhole connection, dimensional stability, and electric properties, the polyamino-bis-maleimide prepolymer (such as the polyimide prepolymer formed of N,N'-4,4'-diphenylmethane-bis-maleimide and 4,4'-diaminodiphenylmethane disclosed in U.S. Pat. Nos. 3,562,223 and Re 29,316) has been used. This polyamino-bis-maleimide prepolymer has the disadvantage that it is soluble only in special expensive solvents such as N-methyl-2-pyrrolidone (boiling point 202° C. at 760 mmHg) and N,N-dimethylformamide (b.p. 153° C.). From the standpoint of working environment and because of the high ratio of residual solvent in the prepreg, adoption of such a special solvent of high boiling point has not proved advantageous. When such a special solvent of high boiling point is used in the manufacture of a heat-resistant laminated sheet, such properties as boiling water absorption ratio and resistance to measling are adversely affected because the removal of the solvent by drying becomes difficult, the prepreg exudes varnish, and the laminate retains the solvent. To save the situation, the imide type prepolymer which is soluble in a low-boiling point ordinary organic solvent and which is obtained by the reaction of an epoxy compound with bis-imide and diamine has been proposed (U.S. Pat. No. 4,346,206). This imide type prepolymer, however, has the disadvantage that it has a lower glass transition point than the polyamino-bis-imide resin consisting solely of bisimide and diamine because it contains the epoxy compound.

In the circumstance, the desirability of development of a laminate using a polyamino-bis-maleimide resin which permits use of such an inexpensive low-boiling point ordinary solvent as ethyleneglycol monomethyl ether or ethyleneglycol monoethyl ether and which has high heat resistance has found growing recognition.

An object of this invention, therefore, is to provide a polyamino-bis-maleimide prepolymer solution which retains thermal stability, entails no three-dimensional hardening at room temperature, and exhibits excellent curing property during the removal of solvent by drying and acquires outstanding heat resistance after curing and a method for the manufacture of this prepolymer.

Another object of this invention is to provide a prepreg of polyamino-bismaleimide prepolymer which is readily curable. Still another object of this invention is to provide prepreg which permits ready removal of the solvent by drying. Yet another object of this invention is to provide a method for the manufacture of a laminate of polyamino-bis-maleimide resin which acquires outstanding heat resistance after curing.

SUMMARY OF THE INVENTION

The objects described above are attained by a polyamino-bis-maleimide prepolymer solution which is obtained by the reaction of 1 mol of N,N'-4,4'-diphenylmethane-bis-maleimide with 0.25 to 0.4 mol of 4,4'-diaminodiphenylmethane in an alkyleneglycol monoalkyl ether as a solvent at elevated temperatures.

The aforementioned objects are also attained by a method for the manufacture of a polyamino-bis-maleimide prepolymer solution which comprises causing 1 mol of N,N'-4,4'-diphenylmethane-bis-maleimide to react with 0.25 to 0.4 mol of 4,4'-diaminodiphenylmehtane to react at elevated temperatures in an alkyleneglycol monoalkyl ether as a solvent.

The aforementioned objects are further attained by a prepreg which is obtained by impregnating a substrate with the aforementioned polyamino-bis-maleimide prepolymer solution and drying the resultant wet substrate thereby expelling the aforementioned solvent therefrom.

The aforementioned objects are attained by a laminate of a polyamino-bis-maleimide resin which is obtained by impregnating a substrate with the aforementioned polyamino-bis-maleimide prepolymer solution, drying the resultant substrate thereby expelling the aforementioned solvent therefrom to produce a prepreg, superimposing a plurality of such prepregs, optionally superimposing a copper foil thereon, and subjecting the resultant composite to heat and pressure.

PREFERRED EMBODIMENT OF THE INVENTION

The polyamino-bis-maleimide prepolymer solution of the present invention is obtained by causing 1 mol of N,N'-diphenyl methane-bis-maleimide to react with 0.25 to 0.4 mol of 4,4'-diaminodiphenylmethane in an alkyleneglycol monoalkyl ether as a solvent at elevated temperatures.

The polyamino-bis-maleimide prepolymer solution thus produced is a homogeneous solution free from suspended particles or precipitation and capable of removal of the solvent by drying. The laminate produced by preparing a plurality of prepregs by the impregnation of substrates with the prepolymer solution, superimposing the plurality of prepregs, optionally superimposing a copper foil thereon, and subjecting the resultant composite to heat and pressure possesses outstanding heat resistance.

Now, the present invention will be described more specifically.

Concerning the mixing ratio of N,N'-4,4'-diphenylmethane-bis-maleimide with 4,4'-diaminodiphenylmethane in the present invention, the proportion of 4,4'-diaminodiphenylmethane is in the range of 0.25 to 0.4 mol, preferably 0.25 to 0.35 mol, per mol of N,N'-4,4'-diphenyl methane-bismaleimide. If the proportion of 4,4'-diaminodiphenylmethane per mol of N,N'-4,4'-diphenylmethanebismaleimide is less than 0.25 mol, the resultant reaction solution suffers from precipitation of N,N'-4,4'-diphenylmethane-bismaleimide. If the proportion of 4,4'-diaminodiphenylmethane per mol of N,N'-4,4'-diphenylmehtane-bismaleimide exceeds 0.4 mol, the resultant polyamino-bismaleimide resin acquires an excessively high molecular weight and consequently a cloudy texture.

Concrete examples of the alkyleneglycol monoalkyl ether include ethyleneglycol monomethyl ether (b.p.

125° C.), ethyleneglycol monoethyl ether (b.p. 136° C.), propyleneglycol monomethyl ether (b.p. 121° C.), propyleneglycol mono-n-propyl ether (b.p. 150° C.), ethyleneglycol mono-n-propyl ether (b.p. 151° C.), and ethyleneglycol mono-iso-propyl ether (b.p. 139° C.). These solvents may be used either singly or in varying combinations of two or more members.

The temperature of the reaction between N,N'-4,4'-diphenylmethane-bis-maleimide and 4,4'-diaminodiphenylmethane is desired to fall in the range of 90° to 160° C., preferably 120° to 140° C. The duratiton of this reaction is desired to fall in the range of 10 minutes to 480 minutes, preferably 20 to 60 minutes. If the reaction temperature and the reaction time deviate from the aforementioned ranges, the reaction solution is liable to suffer from occurrence of precipitation or suspension of particles. The concentration of the solution is not specifically defined. It has only to be such that under the aforementioned reaction conditions, the reaction effectively forms the polyamino-bis-maleimide resin and the solution, when cooled to room temperature, avoids inducing precipitation or suspension of particles. Normally, the concentration falls in the range of 20 to 80% by weight, preferably 40 to 60% by weight.

The polyamino-bis-imide resin solution formed as described above may incorporate as diluting solvent such a low boiling point ordinary solvent as methyl-ethyl ketone or acetone.

The prepreg is obtained by impregnating a substrate with the aforementioned prepolymer solution and then drying the resultant wet substrate thereby expelling the solvent therefrom.

The polyamino-bis-maleimide prepolymer solution of the present invention may contain therein an organic peroxide. Any of the organic peroxides represented by the general formulas, $R_3$—O—O—$R_3$[II] and $R_3$—O—O—$R_4$—O—O—$R_3$[III] wherein $R_3$ stands for

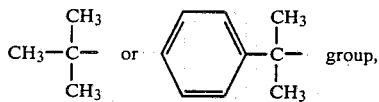

providing that the two $R_3$'s may denote the same or different groups, and $R_4$ stands for

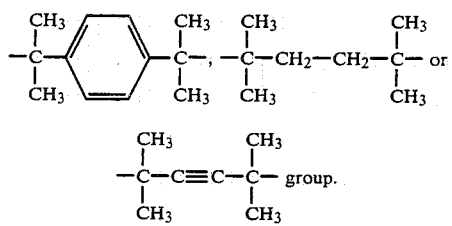

The alkyleneglycol monoalkyl ether to be selected is desired to be such that the boiling point thereof (under 760 mmHg) is lower than the decomposition temperature at which half of the organic peroxide is decomposed within one minute (hereinafter referred to as "Td(½)" for short).

During the removal of the solvent from the alkyleneglycol monoalkyl ether solution of polyamino-bis-maleimide prepolymer containing the organic peroxide, the polyamino-bis-maleimide prepolymer is thermally stable enough to avoid occurrence of three-dimensional curing because the Td(½) of the organic peroxide is higher than the boiling point of the solvent. Moreover, when the polyamino-bis-maleimide prepolymer is subsequently subjected to three-dimensional curing under application of heat, the curing temperature of the prepolymer can be lowered by the action of the organic peroxide as a radical reaction initiator below the level obtained in the system containing no organic peroxide. Otherwise, the curing time may be curtailed by the same reason. The polyamino-bis-maleimide resin which has undergone the three-dimensional curing possesses outstanding heat resistance.

Incidentally, U.S. Pat. No. 3,380,964 discloses use of an organic peroxide in the polyamino-bis-imide prepolymer solution. In this case, however, the organic peroxide is completely decomposed during the removal of the solvent by drying because the solvent has a high boiling point. U.S. Pat. No. 3,839,493 also discloses combined use of polyamino-bis-imide prepolymer, a solvent, and an organic peroxide. In this case, the solvent is not an alkyleneglycol monoalkyl ether but a special solvent. Thus, the proposed combined use has a fair possibility of entailing a problem of defiled working environment or inducing the decomposition of the organic peroxide during the removal of the solvent by drying.

Examples of the organic peroxide usable advantageously in the present invention include dicumyl peroxide (Td(½) 171° C.), t-butyl-cumyl peroxide (Td(½) 176° C.), α,α'-bis(t-butyl peroxisopropyl)-benzene (Td(½) 175° C.), 2,5-dimethyl-2,5-di(t-butyl peroxy)-hexane (Td(½) 179° C.) and 2,5-dimethyl-2,5-di(t-butyl peroxy)-hexyne-3 (Td(½) 193° C.).

Other organic peroxides which have relatively high values of Td(½) include t-butyl-peroxy-benzoate (Td(½) 170° C.) and t-butyl-peroxy-isopropyl carbonate (Td(½) 158° C.). It has been demonstrated that organic peroxides having their ester group countertypes are totally incapable of producing any effect in this invention. The reason for such organic peroxides' incapability of manifesting the expected effect remains yet to be elucidated. This fact may be explained by a postulate that the ester groups have undergone hydrolysis in the presence of traces of water.

The amount of the organic peroxide to be used in the present invention is in the range of 0.1 to 5% by weight, preferably 0.5 to 2% by weight, based on the weight of the polyamino-bis-maleimide prepolymer. If the weight is less than 0.1% by weight, the effect of the added organic peroxide in the improvement of curing property is not conspicuous. If it exceeds 5% by weight, the curing proceeds too fast to permit easy control of the fluidity of the resin during the course of molding. The aforementioned organic peroxides may be used either singly or in varying combinations of two or more members. Optionally, the organic peroxide may be used in conjunction with a radical reaction promoter or a radical reaction inhibitor to facilitate the control of the curing property.

The addition of the organic peroxide may precede the formation of the polyamino-bis-maleimide prepolymer on the condition that the added organic peroxide will not undergo decomposition in the meantime. Preferably, the organic peroxide is added after the polyamino-bis-maleimide prepolymer is formed and cooled to room temperature.

The polyamino-bis-maleimide resin in a three-dimensionally cured form is obtained by drying the organic peroxide-containing alkyleneglycol monoalkyl ether solution of polyamino-bis-maleimide prepolymer obtained as described above thereby expelling the organic solvent therefrom and subsequently subjecting the solvent-free solution to a thermal curing treatment.

Examples of the substrate to be used in the preparation of the prepreg include glass fiber cloth, glass fiber paper, carbon fiber cloth, aramide fiber cloth and quartz fiber cloth.

The temperature for the removal of the solvent by drying is generally 10° to 50° C., preferably 10° to 20° C., higher than the boiling point of the solvent. Optionally, the drying may be effected at a lower temperature under a vacuum.

In the prepreg thus obtained, the amount of the prepolymer (as solids) deposited on the substrate is in the range of 30 to 80% by weight, preferably 40 to 60% by weight, based on the weight of the substrate.

The temperature at which the composite obtained by laminating a plurality of prepregs and optionally laminating a copper foil is subjected to heat and pressure is in the range of 170° to 300° C., preferably 180° to 220° C. The duration of the exposure of the composite to heat and pressure is in the range of 1 to 48 hours, preferably 2 to 4 hours. When desired, the resultant laminated sheet may be subjected to after-curing under normal pressure at the aforementioned heating temperature for the aforementioned time.

In this invention, during the preparation of the prepreg, the polyamino-bis-maleimide prepolymer may be used in combination with a modified resin such as epoxy resin, diallyl phthalate resin, isocyanate, polyfunctional-maleimide resin, or polybutadiene, or with a filler such as glass powder, fused silica, aluminum hydroxide, calcium carbonate, asbestos, clay or talc, and flame retardant.

As described above, the polyamino-bis-maleimide prepolymer remains thoroughly dissolved in such a low boiling point organic solvent as ethylene glycol monomethyl ether (b.p 124° C.) or ethylene glycol monoethyl ether (b.p. 136° C.) at room temperature. The conventional polyamino-bis-maleimide prepolymer is soluble only in an expensive special solvent of high boiling point such as N-methyl-2-pyrrolidone (b.p. 202° C.) and fails to permit thorough removal of the solvent during the removal of the solvent at elevated temperatures. In contrast, the polyamino-bis-maleimide prepolymer of this invention permits use of an inexpensive low boiling point ordinary solvent and, therefore, permits ready removal of the solvent by application of heat. As the result, the amount of the residual solvent in the produced prepreg is notably small. The laminated sheet produced from such prepregs, therefore, acquires outstanding heat resistance.

Now, the present invention will be described more specifically below with reference to working examples. It should be noted that this invention is not limited to these working examples.

EXAMPLE 1

In an four-neck flask provided with a condenser, a stirrer and a thermometer, the following synthesis was carried out. Over an oil bath at 130° C., 100 parts by weight of N,N'-4,4'-diphenylmethane-bis-maleimide

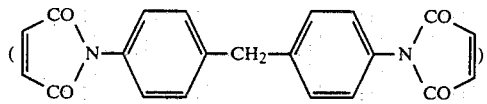

and 16.6 parts by weight of 4,4'-diaminodiphenylmethane

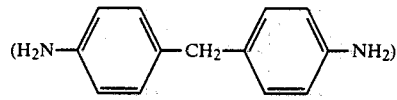

(the molar ratio of bisimide to diamine 1:0.3) were stirred in 116.6 parts by weight of ethylene glycol monomethyl ether for 30 minutes to afford a homogeneous solution of polyamino-bis-maleimide prepolymer. The solution was then cooled to room temperature and the cool solution (50% by weight in concentration) was visually examined for cloudiness. On the following day, neither precipitation nor suspension of particles was detected in the solution.

Sheets of glass fiber cloth 0.2 mm in thickness (produced by Nitto Boseki Co., Ltd. and marketed under trademark designation of G-9020-BY52) were impregnated with the solution and dried at 160° C. for 3 minutes to afford prepregs having a resin content of 45% by weight. These prepregs had a volatile content (calculated from weights found before and after heating at 160° C. for 15 minutes) of 0.5% by weight and retained substantially no solvent.

Eight prepregs thus obtained were laminated and copper foils 35 μm in thickness (produced by Furukawa Circuit Foil Co. and marketed under trademark designation of FC-TAI-35) were placed on each on the opposite outermost prepregs. The composite thus produced was nipped between two mirror plates and cured by application of heat and pressure to produce a copper-clad laminate 1.6 mm in thickness. In this case, the curing conditions were 200° C. of temperature, 2 hours of duration, and 40 kg f/cm$^2$ of pressure. The laminated sheet was subjected to an after-curing treatment at 250° C. for 24 hours.

The properties of the laminated sheet are shown in Table 2. From the table, it is noted that the laminated sheet possessed outstanding heat resistance.

EXAMPLES 2-3 AND CONTROLS 1-2

Polyamino-bis-maleimide prepolymer solutions were obtained by faithfully following the procedure of Example 1, except that the amounts of 4,4'-diaminodiphenylmethane and ethylene glycol monomethyl ether were varied as indicated in Table 1.

The polyamino-bis-maleimide prepolymer solutions obtained in Examples 2-3 showed no visually discernible precipitation or suspension of particles even on the day following their synthesis. The polyamino-bis-maleimide prepolymer solution obtained in Control 1 was found to produce precipitate on the day following its synthesis. The precipitate, on analysis, was identified to be N,N'-4,4'-diphenylmethane-bis-maleimide.

The polyamino-bis-maleimide prepolymer solution of Control 2 showed suspension of particles on the day following its synthesis. The suspended particles were thought to be polyamino-bis-maleimide prepolymer of excessively high molecular weight.

TABLE 1

| Items | Control 1 | Example 2 | Example 1 | Example 3 | Control 2 |
|---|---|---|---|---|---|
| | (parts by weight) | | | | |
| N,N'—4,4'-diphenylmethane-bis-maleimide | 100 | 100 | 100 | 100 | 100 |
| 4,4'-diaminodiphenylmethane | 11.1 | 13.8 | 16.6 | 19.4 | 27.7 |
| ethylene glycol monomethyl ether | 111.1 | 113.8 | 116.6 | 119.4 | 127.7 |
| bisimide:diamine (molar ratio) | 1:0.20 | 1:0.25 | 1:0.30 | 1:0.35 | 1:0.50 |
| Solubility* | x | o | o | o | x |

*Precipitation or turbidity on next day of synthesis.
No: o
Yes: x

TABLE 2

| Items | Unit | Example 1 | Control 3 |
|---|---|---|---|
| Properties of copper clad laminate* | | | |
| Heat resistance to soldering (300° C., float for 5 min.) | — | Normal | Normal |
| Insulation resistance | Ω | 2 × 10$^{15}$ | 2 × 10$^{15}$ |
| Insulation resistance after boiling | Ω | 4 × 10$^{14}$ | 8 × 10$^{13}$ |
| Pressure cooker soldering test** | — | Normal | Measling |
| Glass transition temp.*** | °C. | 320 | 310 |

*Measured based on JIS C-6481 except items  and *.
**After treating (2 atms., 121° C.) by a pressure cooker for 2 hours, it was treated in a solder at 300° C. for 30 seconds.
***Thermo Mechanical Analyser TMA-1500 made by Shinku Riko Kabushiki Kaisha was used. Velocity of elevating temperature was 5° C./min. Load was 5 g.

CONTROL 3

This experiment concerns the N-methyl-2-pyrrolidone solution of polyamino-bis-maleimide prepolymer produced by the melting method. The amount of 16.6 parts by weight of 4,4'-diaminodiphenylmethane was melted by being heated at 125° C. and 100 parts by weight of N,N'-4,4'-diphenylmethane-bis-maleimide (molar ratio of bisimide to diamine 1:0.30) was added to the resultant hot solution to be dissolved therein. The resultant mixture was stirred at 125° C. for 10 minutes to form polyamino-bis-maleimide prepolymer. The prepolymer was then cooled to room temperature and comminuted in a mortar.

Sheets of glass fiber cloth G-9020-BY52 were impregnated with the N-methyl-2-pyrrolidone solution (50% by weight) of polyamino-bis-maleimide prepolymer and then dried at 160° C. for 10 minutes. Consequently, there were obtained prepregs having a resin content of 45% by weight. The volatile content of these prepregs (calculated from the weights found before and after heating at 210° C. for 15 minutes) was 2.7% by weight.

By following the procedure of Example 1, a laminated sheet was prepared by using the prepregs and tested for properties. The results of the test are shown in Table 2. After the pressure cooker solder test (by the steps of treating a given test piece in saturated steam at 2 atmospheres and 121° C. for two hours and subsequently keeping the treated test piece dipped in solder at 300° C. for 30 seconds), the laminated sheet was found to form measling (a phenomenon that cracks develop between the resin and the glass fiber and the crosses of glass fibers appear in a blushed state).

EXAMPLE 4

To the polyamino-bis-maleimide prepolymer solution obtained in Example 1, 3.50 parts by weight of a 33% by weight ethylene glycol monomethyl ether solution of dicumyl peroxide (the amount of dicumyl peroxide added accounting for 1.0% by weight based on polyamino-bis-maleimide prepolymer) were added while under thorough stirring, to afford a homogeneous solution. (The solution has a concentration of 50% by weight).

Sheets of glass fiber cloth 0.2 mm in thickness (produced by Nitto Boseki Co., Ltd. and marketed under trademark designation of G-9020-BY52) were impregnated with this solution and then dried at 160° C. for 3 minutes. Consequently, there were obtained prepregs having a resin content of 45% by weight. The prepregs had a volatile content (calculated from weights found before and after heating at 160° C. for 15 minutes) of 0.74% by weight and retained substantially no solvent.

The prepregs were rubbed in hands to shed polyamino-bis-maleimide prepolymer in powder. With the aid of a differential scanning caloriemeter, Model DSC-II, made by Perkin Elmer Corp., the powder was found to possess exothermic reaction peak temperature of 182° C. (with the temperature increasing rate fixed at 10° C./min.).

Eight prepregs thus obtained were laminated and copper foils 35 μm in thickness (produced by Furukawa Circuit Foil Co. and marketed under trademark designation of FC-TAI-35) were placed one each on the opposite outermost prepregs. The composite thus produced was nipped between two mirror plates and cured by application of heat and pressure to produce a copper-clad laminate 1.6 mm in thickness. In this case, the curing conditions were 200° C. of temperature, 2 hours of duration, and 40 kg f/cm$^2$ of pressure.

The properties of the copper-clad laminate are shown in Table 3. It is noted that the laminate, though not after-cured, notably excelled in heat resistance.

EXAMPLES 5-7 AND CONTROLS 4-6

Polyamino-bis-maleimide prepolymer solutions were produced by following the procedure of Example 4, except that varying organic peroxides shown in Table 3 were used severally in the place of dicumyl peroxide. The exothermic reaction peak temperatures of the polyamine-bis-maleimide prepolymers of Examples 5-7 determined by DSC were more than 40° C. lower than those of the polyamino-bis-maleimide prepolymers of Controls 4-6 similarly determined. This fact indicates that the present invention is effective in lowering the curing temperature.

In Example 7, a copper-clad laminate was prepared by following the procedure of Example 4. The results are shown in Table 4. This laminate showed unusually high heat resistance.

EXAMPLE 8

A polyamino-bis-maleimide prepolymer was obtained by following the procedure of Example 4, except that propylene glycol monomethyl ether was used in the place of ethylene glycol monoethyl ether. By DSC, the prepolymer was found to have an exothermic reaction peak temperature of 184° C.

TABLE 3

| (parts by weight) | Example 4 | Example 5 | Example 6 | Example 7 | Control 4 | Control 5 | Control 6 |
|---|---|---|---|---|---|---|---|
| N,N'—4,4'-diphenyl-methane-bis-maleimide | 100 | 100 | 100 | 100 | 100 | 100 | 100 |
| 4,4'-diamino-diphenyl-methane | 16.5 | 16.5 | 16.5 | 16.5 | 16.5 | 16.5 | 16.5 |
| ethylene glycol monomethyl ether | 117.6 | 117.6 | 117.6 | 117.6 | 116.5 | 117.6 | 117.6 |
| organic peroxide | 1.16 | 1.16 | 1.16 | 1.16 | 0 | 1.16 | 1.16 |
| Name of organic peroxide | dicumyl peroxide | t-butyl cumyl peroxide | 2,5-dimethyl 2,5-di(butyl peoxy)hexane | 2,5-dimethyl 2,5-di(t-butyl peroxy)hexine-3 | — | t-butyl peroxy benzoate | t-butyl peroxy isopropyl carbonate |
| Td (½) [°C.] | 171 | 176 | 179 | 193 | — | 170 | 158 |
| Peak temperature of exothermic reaction by DSC (°C.) | 182 | 190 | 193 | 197 | 241 | 247 | 247 |

TABLE 4

| | Properties of copper clad laminate* | | |
|---|---|---|---|
| Items | Unit | Example 4 | Example 7 |
| Heat resistance to soldering (300° C., float for 5 min.) | — | Normal | Normal |
| Insulation resistance | Ω | $2 \times 10^{13}$ | $3 \times 10^{13}$ |
| Insulation resistance after boiling | Ω | $4 \times 10^{11}$ | $7 \times 10^{11}$ |
| Volume resistivity | Ω · cm | $2 \times 10^{14}$ | $2 \times 10^{14}$ |
| Surface resistance | Ω | $1 \times 10^{13}$ | $3 \times 10^{13}$ |
| Dielectric constant | — | 4.7 | 4.6 |
| Dielectric dissipation factor | — | 0.010 | 0.009 |
| Pressure cooker soldering test** | — | Normal | Normal |
| Glass transition temp.*** | °C. | 190 | 203 |

*Measured based on JIS C-6481 except items  and *.
**After treating (2 atms., 121° C.) by a pressure cooker for 2 hours, it was treated in a solder at 260° C. for 30 seconds.
***Thermo Mechanical Analyser TMA-1500 made by Shinku Riko Kabushiki Kaisha was used. Velocity of elevating temperature was 5° C./min. Load was 5 g.

As described above, the polyamino-bis-maleimide prepolymer produced by this invention permits easy removal of the solvent by drying and enjoys high thermal stability. Use of an organic peroxide serves to lower the curing temperature and curtail the curing time. The polyamino-bis-maleimide resin produced after three-dimensional curing acquires outstanding heat resistance. This invention, thus, has high economic value.

What is claimed is:

1. A polyamino-bis-maleimide prepolymer solution obtained by the reaction at a reactive temperature of 1 mol of N,N'-4,4'-diphenylmethane-bis-maleimide with 0.25 to 0.4 mol of 4,4'-diaminodiphenylmethane in an alkyleneglycol monoalkyl ether as a solvent until the stated prepolymer solution is obtained.

2. A prepolymer solution according to claim 1, wherein alkyleneglycol monoalkyl ether is at least one member selected from the group consisting of ethylene glycol monomethyl ether, ethylene glycol monoethyl ether, propylene glycol monoethyl ether, propylene glycol mono-n-propyl ether, ethylene glycol mono-n-propyl ether and ethylene glycol monoisopropyl ether.

3. A prepolymer solution according to claim 1, further comprising a reactive but non-reacted organic peroxide represented by the general formula $R_3-O-O-R_3$(II) or $R_3-O-O-R_4-O-OR_3$(III) wherein $R_3$ stands for

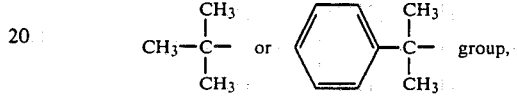

providing that the two $R_3$'s may denote the same or different groups, and $R_4$ stands for

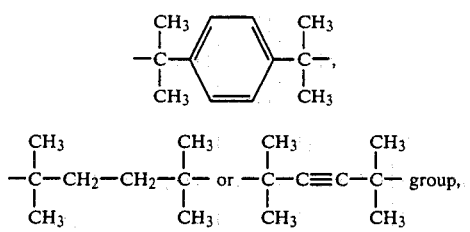

is incorporated.

4. A prepolymer solution according to claim 3, wherein said organic peroxide is incorporated in the amount of 0.1 to 5% by weight based on polyamino-bis-maleimide prepolymer.

5. A prepolymer solution according to claim 3, wherein said organic peroxide is at least one member selected from the group consisting of dicumyl peroxide, t-butyl peroxide, t-butyl cumyl peroxide, α,α'-bis(t-butylperoxy-isopropyl)-benzene, 2,5-dimethyl-2,5-di(t-butylperoxy)hexane and 2,5-dimethyl-di(t-butyl peroxy)-hexyne.

6. A prepolymer solution according to claim 3, wherein said alkyleneglycol monoalkyl ether has a boiling point (under 760 mmHg) lower than the decomposition temperature at which half of the organic peroxide is decomposed within one minute.

7. A method for the manufacture of a polyamino-bis-maleimide prepolymer solution, which comprises causing 1 mol of N,N'-4,4'-diphenylmethane-bis-malemide to react at a reactive temperature with 0.25 to 0.4 mol of 4,4'-diaminodiphenylmethane in an alkyleneglycol monoalkyl ether as a solvent until the stated prepolymer solution is obtained.

8. A method according to claim 7, wherein said thermal reaction is carried out at a temperature in the range of 90° to 160° C. for a period in the range of 10 to 480 minutes.

9. A prepolymer solution according to claim 1, wherein the reaction temperature is between about 90 and about 160 degrees C. and the duration of the reaction is between about 10 and about 480 minutes.

* * * * *

UNITED STATES PATENT AND TRADEMARK OFFICE
CERTIFICATE OF CORRECTION

PATENT NO. : 4,598,115

DATED : July 1, 1986

INVENTOR(S) : Atsushi Fujioka, Yasuo Miyadera and Tomio Fukuda

It is certified that error appears in the above-identified patent and that said Letters Patent is hereby corrected as shown below:

Col. 2, lines 13 & 14; "-diaminodiphenylmehtane" should read
-- -diaminodiphenylmethane --
Col. 2, line 63; "-diphenylmehtane-" should read
-- -diphenylmethane- --
Col. 3, line 11; "duratiton" should read -- duration --
Col. 6, line 37; "on" (first occurrence) should read -- one --
Col. 8, line 51; "polyamine-" should read -- polyamino- --
Col. 9, line 59; after "wherein" insert -- said --
Col. 10, line 56; "-malemide" should read -- maleimide --

Signed and Sealed this

Thirtieth Day of December, 1986

Attest:

DONALD J. QUIGG

*Attesting Officer*          *Commissioner of Patents and Trademarks*